(12) United States Patent
Nagarajan et al.

(10) Patent No.: US 9,671,580 B1
(45) Date of Patent: Jun. 6, 2017

(54) PHOTONIC TRANSCEIVING DEVICE PACKAGE STRUCTURE

(71) Applicant: INPHI CORPORATION, Santa Clara, CA (US)

(72) Inventors: Radhakrishnan L. Nagarajan, Santa Clara, CA (US); Peng-Chih Li, Santa Clara, CA (US); Masaki Kato, Palo Alto, CA (US); Chris Togami, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/075,021

(22) Filed: Mar. 18, 2016

Related U.S. Application Data

(63) Continuation-in-part of application No. 14/789,290, filed on Jul. 1, 2015, now Pat. No. 9,496,959.

(51) Int. Cl.
*H04B 10/00* (2013.01)
*G02B 6/42* (2006.01)
(Continued)

(52) U.S. Cl.
CPC ............. *G02B 6/4257* (2013.01); *G02B 6/32* (2013.01); *G02B 6/3849* (2013.01);
(Continued)

(58) Field of Classification Search
CPC ...... G02B 6/4257; G02B 6/32; G02B 6/3849; G02B 6/3893; G02B 6/4206; G02B 6/4208; G02B 6/428; G02B 6/4284; G02B 6/4292; G02B 6/4295; G02B 6/4246; G02B 6/43; G02B 6/12004; H04B 1/3833; H04B 10/503; H04B 10/40; H04B 10/51; H05K 3/30; H04J 14/02
(Continued)

(56) References Cited

U.S. PATENT DOCUMENTS

| | | | |
|---|---|---|---|
| 7,171,081 B1 * | 1/2007 | Ko ..................... | G02B 6/29361 385/31 |
| 8,300,994 B2 * | 10/2012 | Welch ................... | B82Y 20/00 385/14 |

(Continued)

*Primary Examiner* — Tesfaldet Bocure
(74) *Attorney, Agent, or Firm* — Richard T. Ogawa; Ogawa P.C.

(57) ABSTRACT

An apparatus for packaging a photonic transceiver. The apparatus includes a case having a base member, two partial side members, and a lid member to provide a spatial volume with an opening at a back end of the base member. Additionally, the apparatus includes a PCB installed inside the spatial volume over the base member with a pluggable connector at the back end. The apparatus includes one or more optical transmitting devices being mounted upside-down via a flex circuit board bended 180 degrees inward to a backside of the PCB and including a built-in TEC module in contact with the lid member. Furthermore, the apparatus includes a silicon photonics chip including a fiber-to-silicon attachment module, mounted on the PCB and coupled to a modulation driver module and a trans-impedance-amplifier module. Moreover, the apparatus includes an optical input port and output port being back connected to the fiber-to-silicon attachment module.

20 Claims, 15 Drawing Sheets

(51) Int. Cl.
  *H04B 10/40* (2013.01)
  *H04B 10/50* (2013.01)
  *G02B 6/38* (2006.01)
  *G02B 6/32* (2006.01)
  *H05K 3/30* (2006.01)
  *H04B 1/3827* (2015.01)

(52) U.S. Cl.
  CPC ......... *G02B 6/3893* (2013.01); *G02B 6/4206* (2013.01); *G02B 6/4208* (2013.01); *G02B 6/428* (2013.01); *G02B 6/4284* (2013.01); *G02B 6/4292* (2013.01); *G02B 6/4295* (2013.01); *H04B 1/3833* (2013.01); *H04B 10/40* (2013.01); *H04B 10/503* (2013.01); *H05K 3/30* (2013.01)

(58) Field of Classification Search
  USPC .................................. 398/135, 140; 385/14
  See application file for complete search history.

(56) References Cited

U.S. PATENT DOCUMENTS

| | | | |
|---|---|---|---|
| 9,548,817 B1* | 1/2017 | Nagarajan | H04B 10/501 |
| 9,553,671 B1* | 1/2017 | Nagarajan | H04B 10/40 |
| 2009/0297159 A1* | 12/2009 | Margolin | G02B 6/4201 |
| | | | 398/135 |
| 2015/0147062 A1* | 5/2015 | Otte | H04B 10/506 |
| | | | 398/79 |

* cited by examiner

PHOTONIC TRANSCEIVING DEVICE PACKAGE STRUCTURE

CROSS-REFERENCE TO RELATED APPLICATIONS

The present application is a continuation-in part application of and incorporates by reference, for all purposes, the following patent application: U.S. patent application Ser. No. 14/789,290, filed Jul. 1, 2015, now issued as U.S. Pat. No. 9,496,969 on Nov. 15, 2016.

BACKGROUND OF THE INVENTION

The present disclosure is related to a photonic transceiver package structure, more particularly, to a silicon photonic transceiver package structure that conforms to the QSFP specification with modified TOSA laser assembly.

As science and technology are progressing rapidly, processing speed and capacity of the computer increase correspondingly. The communication transmission or reception using the traditional cable is limited to bandwidth and transmission speed of the traditional cable, but the mass information transmission required in modern life causes the traditional communication transmission overload. To address such requirements, the optical fiber transmission system replaces the traditional communication transmission system gradually. The optical fiber transmission system does not have bandwidth limitation, and also has advantages of high speed transmission, long transmission distance, its material is impervious to electromagnetic waves. Therefore, the electronics industry performs research toward optical fiber transmission which will become the mainstream in the future. Said optical communication is a technology in that light waves function as signal carriers and transmitted between two nodes via the optical fiber. Field of optical communication can be divided into optical communication side and electric communication side according to transmission medium. By the optical transceiver, the received optical signal can be converted to an electrical signal capable of being processed by an IC, or the processed electrical signal can be converted to the optical signal to be transmitted via optical fiber. Therefore, objective of communication can be achieved.

Wavelength-division multiplexing (WDM) is a multitask technology of processing multiple optical carrier signals transmitted by the optical fiber, and this technology is applied on the different wavelength signal or transmission of laser optical source. This technology is implemented in both directions on the optical fiber to double total transmission capacity. Besides, the term "wavelength-division multiplexing" is mostly applied in optical carrier, and frequency-division multiplexing is applied in radio carrier. Moreover, both of wavelength and frequency are in reciprocal relationship, so their concept can be applied to each other.

Wavelength-division multiplexing is implemented by dividing the work wavelength of optical fiber into multiple channels to enable mass data transmission in one optical fiber. A whole wavelength-division multiplexing (WDM) system can be divided into a wavelength division multiplexer at transmitting end and a wavelength division demultiplexer at receiving end. At present, there are commercial wavelength division multiplexer/demultiplexer which can divide 80 or more channels in the optical fiber communication system, so that the data transmission speed can exceed grade of Tb/s effectively.

In both transmitting and receiving ends of the optical fiber communication system, the transmitting module adapted for WDM technology, the connector usually has single light transmitter structure. However, such light transmitter structure can emit optical signals with different frequencies, but cannot be repaired for individual frequency. Therefore, whole light transmitter must be replaced if being damaged, and it causes larger consumption in cost.

BRIEF SUMMARY OF THE INVENTION

The present disclosure is related to a photonic transceiver package structure, more particularly, to a silicon photonic transceiver package that conforms to the QSFP specification adapted for modified TEC-TOSA laser assembly.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. In order to resolve the inter-symbol interference (ISI) problems caused by bandwidth limitations, we need to bring all electrical components as close as possible to reduce the distance or channel length among them. Stacking chips into so-called 3-D ICs promises a one-time boost in their capabilities, but it's very expensive. Another way to achieve this goal in this disclosure is to use multiple chip module technology.

In an example, an alternative method to increase the bandwidth is to move the optical devices close to electrical device. Silicon photonics is an important technology for moving optics closer to silicon. In this patent application, we will disclose a high speed electrical optics multiple chip module device to achieve terabits per second speed, as well as variations thereof.

In a specific embodiment, the present invention provides an apparatus for packaging a photonic transceiver. The apparatus includes a case, comprising a base member, two partial side members being connected by a joint piece and coupled to the base member, a lid member including a cover coupled to the two partial side members and the base member to provide a spatial volume with an opening at a back end of the base member. The apparatus further includes a PCB installed inside the spatial volume over the base member. The PCB includes a board body extended from a front edge to a back edge. The back edge is near the opening at a back end of the base member. The board body includes an array of metallic pin stripes at the back edge to form a pluggable electrical interface connector. Additionally, the apparatus includes one or more optical transmitting devices. Each of the one or more optical transmitting devices is mounted upside-down on the PCB near the front edge and includes a TEC module being in thermal contact with the lid member and a laser output port aiming toward the back edge. Furthermore, the apparatus includes a silicon photonics chip mounted on the PCB. The silicon photonics chip includes a fiber-to-silicon attachment module to couple with a first fiber from each of the laser output port. Moreover, the apparatus includes an optical input port and an optical output port disposed together on a front end of the base member near the joint piece for the two partial side members. Each optical input port and optical output port is back connected via a second fiber to the fiber-to-silicon attachment module.

In another specific embodiment, the present invention provides a package structure for a photonic transceiver. The package structure includes a case including a top shell member, a bottom shell member, and a pull handle attached with two partial side members being connected to the top shell member and bottom shell member to provide a spatial volume with a first open end and a second open end. Additionally, the package structure includes a PCB installed inside the spatial volume on the bottom shell member for mounting the photonic transceiver. The PCB includes a pluggable electrical interface connector near the second open end. The photonics transceiver includes a silicon photonics chip, a PAM-ASIC chip, and two TOSA laser assemblies. Each TOSA laser assembly is disposed in an upside-down configuration with the TEC module being in thermal contact with the top shell member and has a laser output port aiming toward the second open end. Furthermore, the package structure includes a cap structure disposed over the silicon photonics chip. The cap structure includes a fiber routing mechanism for routing a first optical fiber coming out of each laser output port of the two TOSA laser assemblies before the first optical fiber being guided to couple with the silicon photonics chip. Moreover, the package structure includes an optical input port and an optical output port disposed on the bottom shell member near the first open end and respectively tailed with a pair of second optical fibers. Each second optical fiber is routed by the cap structure before being guided to couple with the silicon photonics chip.

In an alternative embodiment, the present invention provides a method for packaging a compact photonics transceiver. The method includes providing a bottom shell member including a partial surrounding edge with a first overlapping seam structure and mounting a PCB on the bottom shell member. Additionally, the method includes disposing a pair of TOSA laser assemblies on top of a holder on top side of the PCB. Each TOSA laser assembly is positioned in parallel with its laser output port pointing towards a back end of the PCB and a TEC base facing upward. The method further includes disposing a pair of optical input/output ports in front of the PCB on part of surrounding edge with overlapping seam structure and mounting a silicon photonics chip on the top side of the PCB behind the laser output port of each TOSA laser assembly. Furthermore, the method includes disposing a cap structure over the silicon photonics chip. The cap structure is configured to be a fiber router for receiving optical fibers coming from both the pair of optical input/output ports and the pair of laser output ports before delivering these optical fibers to couple with the silicon photonics chip. The method further includes disposing a top shell member having partial surrounding side walls configured with a second overlapping seam structure matching with the first overlapping seam structure to engage with the bottom shell member. Moreover, the method includes installing a pull-release handle having two side members configured to couple with the side walls of the top shell member.

The present disclosure of the compact photonic transceiver package structure provides at least following advantages. First, the package structure for the photonic transceiver includes a modified TOSA assembly with a holder for supporting LC receptacles and a clip for maintaining the LC ferrule to stub contact in TOSAs. The silicon photonics chip in the package is added with a dust cap to protect wire bonding between the chip and the PCB. The dust cap is also configured to be part of a fiber-routing structure to allow change of fiber routing from short direct coupling to long routed coupling with the silicon photonics chip to relax fiber stress and increase reliability. Several other changes on mechanical design modification and electronics chip integration are made aiming to improve the assembly.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
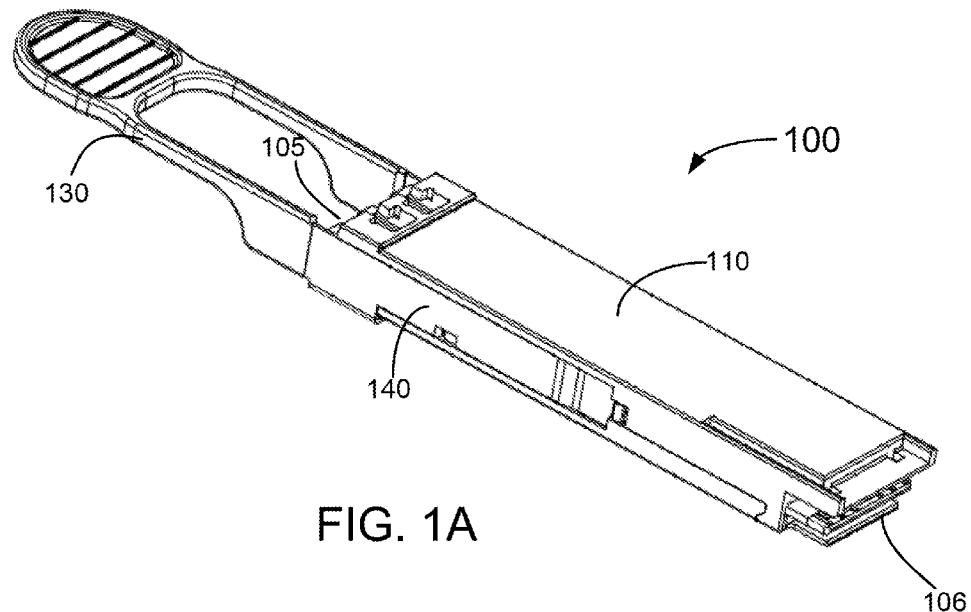
FIG. 1A is a perspective top view of a photonic transceiver package structure with lid according to an embodiment of the present invention.

The present disclosure is related to a photonic transceiver package structure, more particularly, to a silicon photonic transceiver package structure in Quad Small Form-factor Pluggable (QSFP) specification adapted with multiple thermoelectric-cooled transmitter optical sub-assembly (TEC-TOSA) laser devices disposed upside down to keep heat sinks away from a printed circuit board (PCB) and laid reversely in orientation of laser output port relative to optical input/output port of the transceiver. In certain embodiments, the invention is applied for high bandwidth optical communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1A is a schematic top view of a photonic transceiver package structure with lid member according to an embodiment of the present invention. As shown, the photonic transceiver package structure is compatible with the Quad Small Form-factor Pluggable (QSFP) specification, which is designed for a compact small form factor, hot-pluggable photonic transceiver package 100 used for high speed data communications applications. Technically, the small form factor pluggable transceiver allows data rates of 4×10 Gbit/s, 4×28 Gbit/s or higher. A pull handle 130 is included at the front end 105 for easy handling of plugging or unplugging of the photonic transceiver package 100 (with a photonic transceiver installed within the package structure but not visible yet in this figure) into or out of a port of communication network system terminals such as routers, switches, and transport gear. At the same front end 105 of the QSFP package structure, two optical ports are disposed (one input and one output, not visible in FIG. 1A and will be shown later).

Figure 1B:
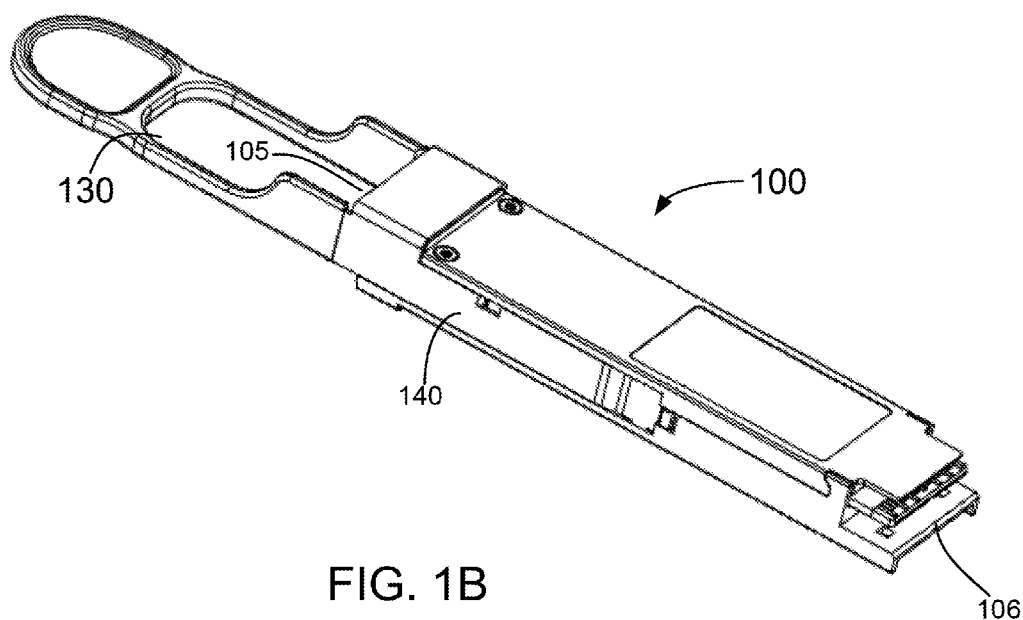
FIG. 1B is a perspective bottom view of a photonic transceiver package structure with lid according to the embodiment of the present invention.

FIG. 1B is a schematic bottom view of a photonic transceiver package structure with lid member according to the embodiment of the present invention. The bottom view shows a removable lid member 110 still been placed by coupling with the side members 140 of the QSFP package structure 100. The electrical connection on a PCB is barely visible at the back end 106 of the QSFP package structure 100 for connecting with system terminals via a simple plug-in operation.

Figure 1C:
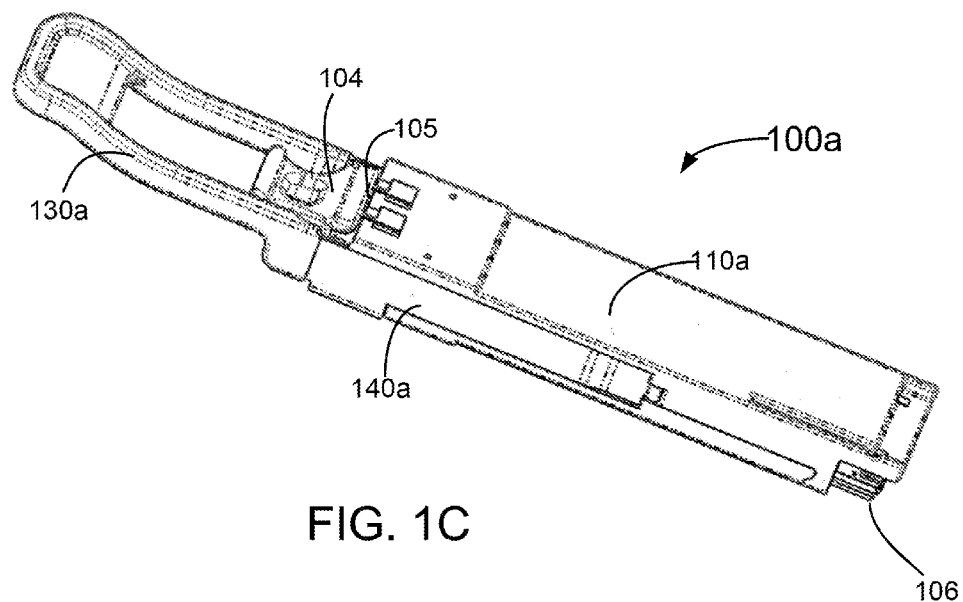
FIG. 1C is a perspective top view of a photonic transceiver package structure with lid according to another embodiment of the present invention.

FIG. 1C is a perspective top view of a photonic transceiver package structure with lid according to another embodiment of the present invention. As shown, the photonic transceiver package structure 100a is still compatible with the Quad Small Form-factor Pluggable (QSFP) specification enclosed with a modified TOSA assembly integrated with a Silicon Photonics chip with improved fiber routings. In this transceiver package structure, the pull handle 130a is shown to be slightly different from the pull handle 130 of previous design. The top shell 110a is substantially the same as the top shell 110 except some inner side features (not visible here) are modified with overlapping seams and form-in-place conductive gaskets being added around edges of the top shell 110a for electromagnetic interference (EMI) suppression while keeping both shells electrically grounded. Also it shows that a Dust Cap 104 is plugged into the front end 105.

Figure 1D:
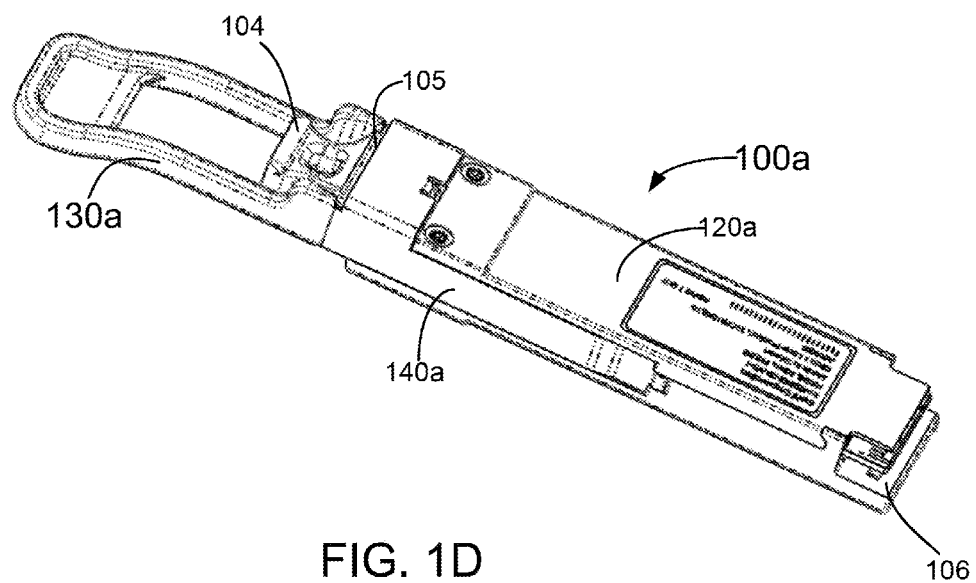
FIG. 1D is a perspective bottom view of a photonic transceiver package structure with lid according to the embodiment of the present invention.

FIG. 1D is a perspective bottom view of a photonic transceiver package structure with lid according to the embodiment of the present invention. This is the same package structure 100a shown in FIG. 1C but being flipped over to reveal the bottom shell 120a which is mated with the top shell including mated overlapping seams at least on partial edges to eliminate any straight line of sight path for the whole module package. A pair of spring hole apertures in shell-shell joint regions is also eliminated in this embodiment for reducing potential risk EMI emission. The electrical connection on a PCB is barely visible at the back end 106 of the QSFP package structure 100a for connecting with system terminals via a simple plug-in operation.

Figure 1E:
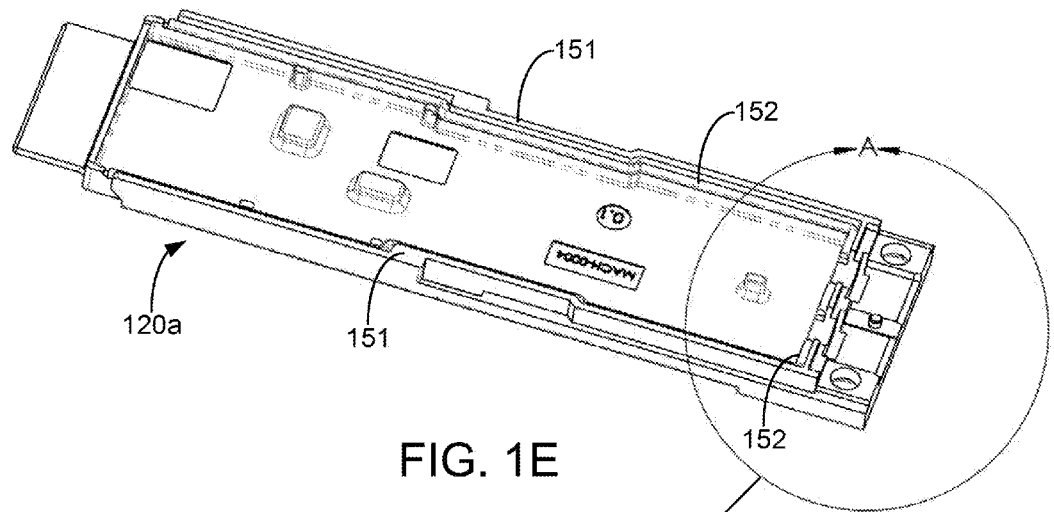
FIG. 1E is a perspective view of an upper side of the bottom lid member according to another embodiment of the present invention.

FIG. 1E is a perspective view of an upper side of the bottom lid member according to another embodiment of the present invention. This diagram is merely an example, which should not unduly limit the scope of the claims. One of ordinary skill in the art would recognize many variations, alternatives, and modifications. As shown, by removing other components and showing the bottom shell 120a only, a full overlapping seam 151 all along the edges of the bottom shell 120a including sides of module as well as around the front end for the optical input/output ports. The overlapping seam 151 is configured to be within 0.10 mm of a matting surface on the top shell 110a. The bottom lid member 120a has a lower step structure next to a wall structure configured to mate the top shell 110a having an additional wall that is extended inside of the bottom shell wall structure. Thus, no straight line of sight path is seen after mating both the top shell and bottom shell together, substantially reducing EMI emission.

Additionally, a form-in-place conductive gasket 152 is disposed on the lower step structure around the edge wall of the bottom shell 120a. When the top shell 110a is mated with the bottom shell 120a, the utmost surface of the edge wall (extended inside the bottom shell wall) will be in contact with the form-in-place conductive gasket 152. This ensures good electrical grounding between the two shells.

Figure 1F:
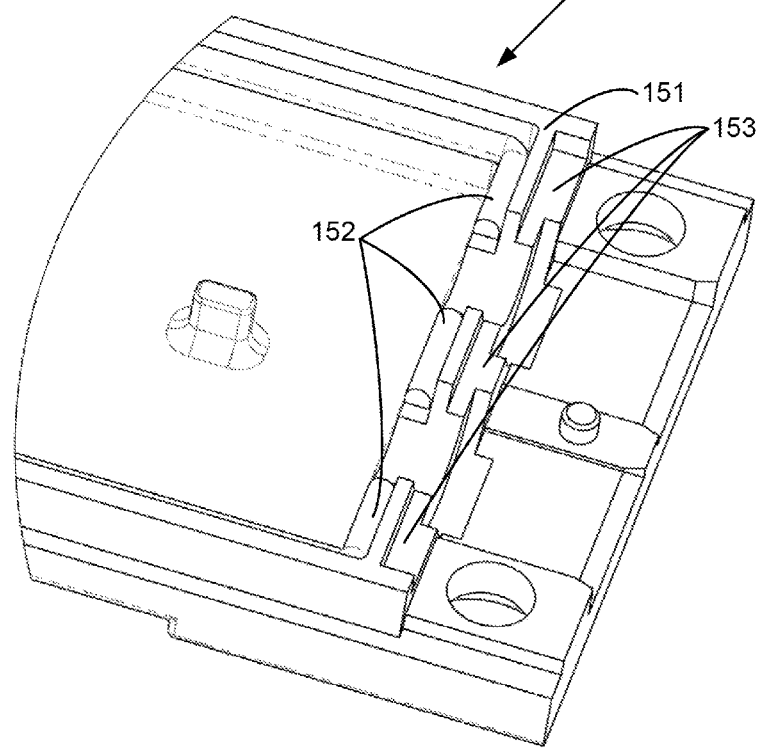
FIG. 1F is a perspective view of a circled part of FIG. 1E according to the embodiment of the present invention.

FIG. 1F is a perspective view of a circled part of FIG. 1E according to the embodiment of the present invention. As shown in more details in region around the optical input/output ports, a second overlapping seam 153 is added outside the bottom shell wall. Because the shell wall shape around the optical input/output ports is more complicated due to the split half-moons shape for the OSA mounting, adding a second overlapping seam 153 is for double securing the sealing for eliminating EMI emission. Also, the form-in-place gasket 152 is split to several sections for fitting the split wall structure for making good contact on the counterpart of the extended wall section of the top shell (not shown).

Figure 2A:
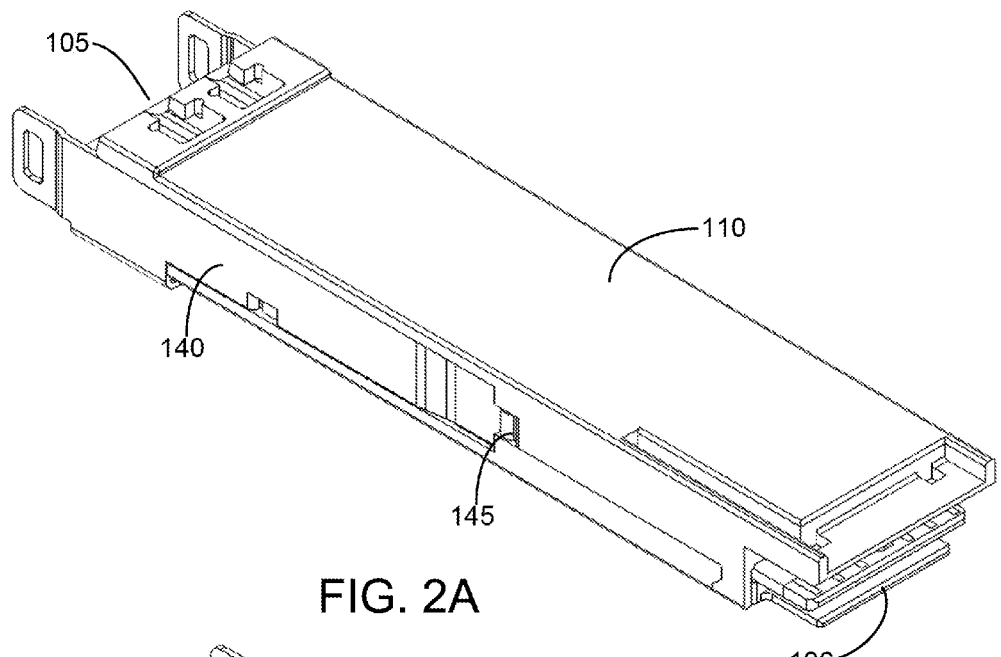
FIG. 2A is a perspective top view of a photonic transceiver package structure without a pull handle but with lid member according to the embodiment of the present invention.
Figure 2B:
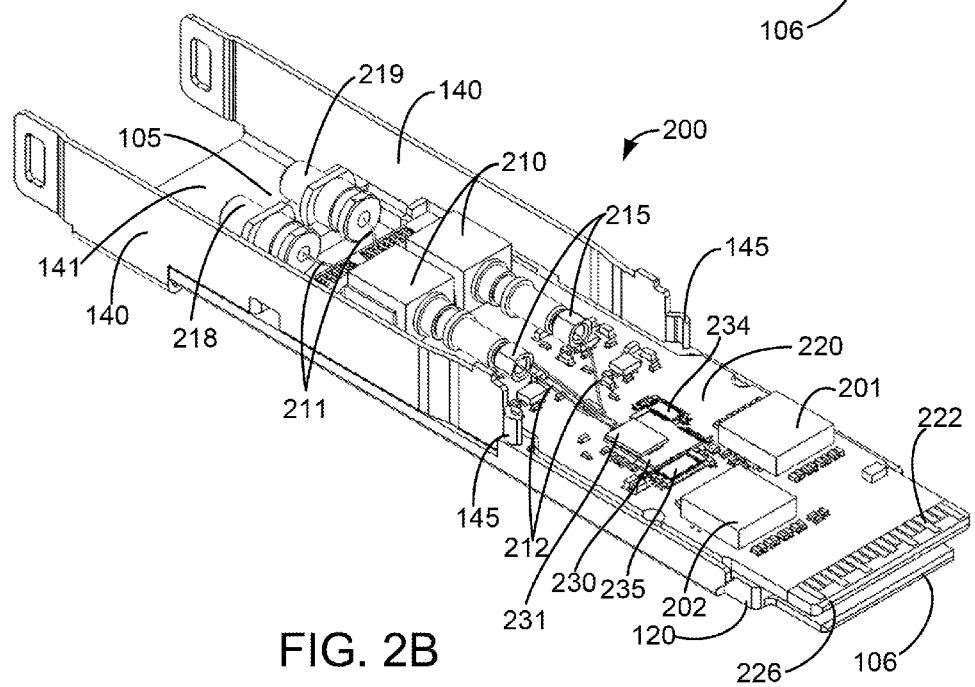
FIG. 2B is a perspective top view of a photonic transceiver package structure without lid member according to the embodiment of the present invention.

FIG. 2A is a schematic top view of a photonic transceiver package structure with a lid member in position according to the embodiment of the present invention. This diagram is merely an example, which should not unduly limit the scope of the claims. One of ordinary skill in the art would recognize many variations, alternatives, and modifications. The pull handle has been removed from the package structure. FIG. 2B is a schematic top view of a photonic transceiver package structure without the pull handle and lid member according to the embodiment of the present invention. This diagram is merely an example, which should not unduly limit the scope of the claims. One of ordinary skill in the art would recognize many variations, alternatives, and modifications. As shown, the lid member 110 has been removed from a clip structure 145 on the side member 140 to reveal the layout of a photonic transceiver 200 inside the package structure 100. In an embodiment, the side member 140 has two vertical pieces coupled to side edges of a base member 120. The two vertical pieces 140 are connected by a horizontal joint piece 141 leveled with the base member 120. The joint piece 141 is located near a front end of the base member 120. In another embodiment, the lid member 110 includes a cover and a pair of partial side pieces to couple with the base member 120 to provide a space volume that can hold the photonic transceiver 200 therein, which is revealed in FIG. 2B, while leaving an opening at a back end 106 of the base member 120.

As shown in FIG. 2B, the photonic transceiver 200 includes a pair of optical ports 218, 219 and a PCB 220 mounted on the base member. One optical port 218 is designed as an optical input port for the transceiver 200 and another port 219 is an optical output port. Both optical ports are disposed in parallel along length direction near a front end region of the base member 120, just recessed from the horizontal joint piece 141 for the side member 140. The front side of the optical input port 218 and optical output port 219 are respective part of two optical connectors suitable in the industry. For example, a paired multi-fiber push on (MPO) or LC connector can be used, one fiber for the optical input port 218 and another fiber for the optical output port 219. The back side of each port is connected by an optical fiber 211 for internal connection inside the package structure 100 of the photonic transceiver 200. The PCB 220 is located a short distance away from the optical input port 218 and optical output port 219 and extended toward the back end 106 of the base member 120 of the photonic transceiver package structure 100.

Referring to FIG. 2B, additionally, several elements for the photonic transceiver 200 are mounted on the PCB 220. First of all, a pair of transmitting devices 210 is mounted near the front part of the PCB 220. In an alternative embodiment, more than two such devices can be optionally installed. In a specific embodiment, each transmitting device 210 is a laser device, or particular here is a TEC-TOSA laser device. As shown, each TEC-TOSA laser device 210 is installed with its laser output port orientated in opposite direction of the optical input/output port 218/219 so that each laser output port has a fiber 212 coming out towards the back end 106. The fiber 211 from the optical input/output ports 218/219 is laid under the transmitting device 210. Both fiber 212 and fiber 211 are then configured to couple with a fiber-to-silicon attachment module 231 of a silicon photonics chip 230 which is mounted in the middle of the PCB 220. The silicon photonics chip 230 is coupled to two modules, a driver module 234 and a TIA (trans-impedance amplifier) module 235 for independently processing electrical/optical signals of the photonic transceiver 200. Furthermore, two ASIC chips 201 and 202 are mounted on the PCB 220 near the back edge 226 to control electrical interface for communication with network system via multiple metallic pin stripes 222 disposed at the back edge 226 of the PCB 220, which will be accessible for plugging into a system apparatus through the opening near the back end 106 of the photonic transceiver package 100 when the lid member 110 is placed back.

Figure 2C:
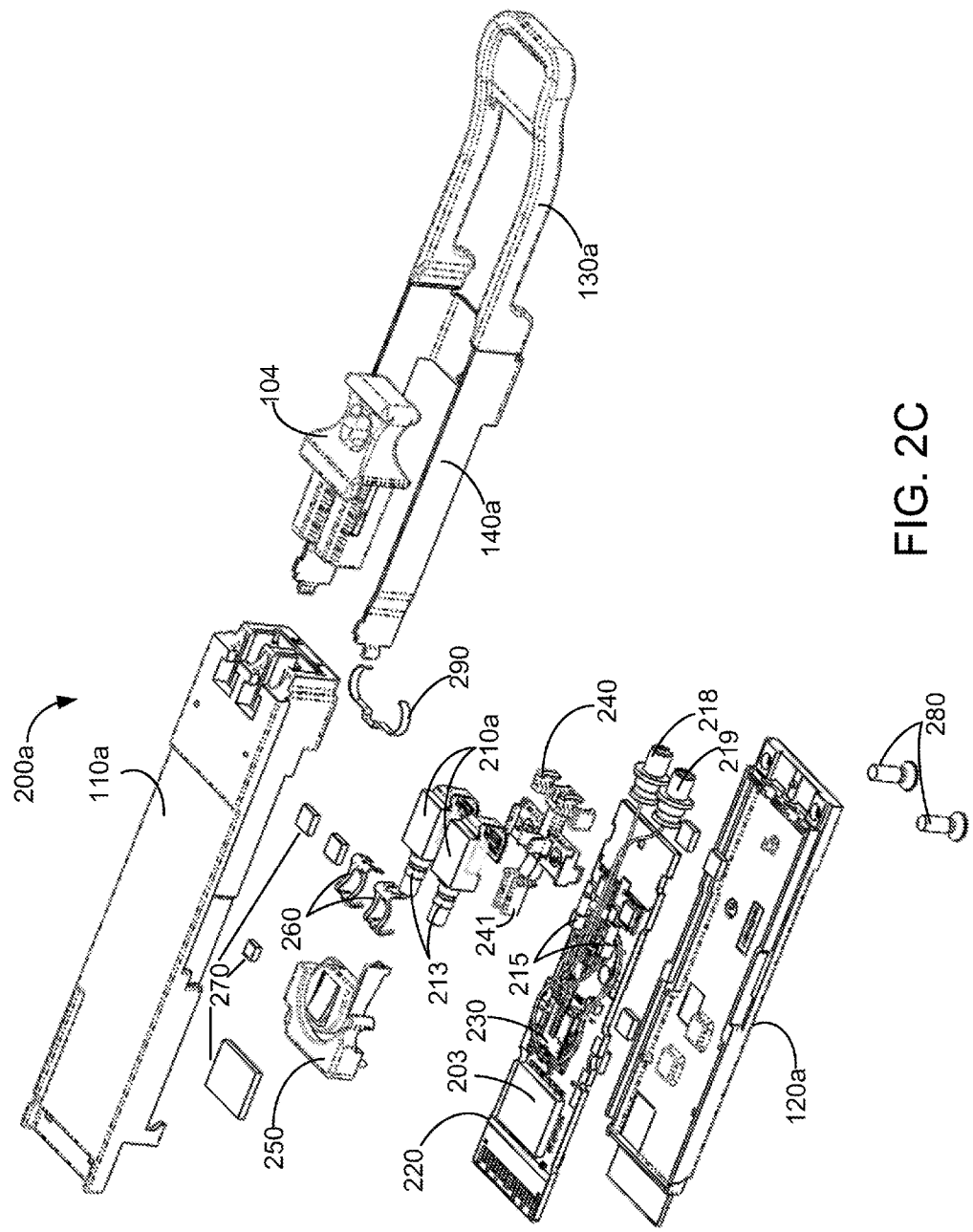
FIG. 2C is an exploded view of a photonic transceiver package structure without lid member according to another embodiment of the present invention.

FIG. 2C is an exploded view of a photonic transceiver package structure without lid member according to another embodiment of the present invention. This diagram is merely an example, which should not unduly limit the scope of the claims. One of ordinary skill in the art would recognize many variations, alternatives, and modifications. As shown, the photonic transceiver package structure 200a is substantially similar to the previous one shown in FIG. 2B but with following modifications. A major modification is a modified TOSA assembly 210a and its peripheral configuration. Internal structure changes of the TOSA assembly are visible here and will be disclosed in later sections of the specification. One visible outside change of the TOSA assembly 210a is the electrical connection circuit board being bended inward instead of outward to save PCB area. The peripheral configuration around the TOSA assembly 210a includes a replacement of new TOSA holder 240 for adapting the modified TOSA assembly 210a. The TOSA holder 240 also includes a coherent middle fiber holder 241 configured to be at a slightly raised level for guiding optical fibers coming from the optical input/output ports (218/219) for modified fiber routing mechanism (to be shown below). A pair of clips 260 are added to respectively hold two LC Ferrules 215 in their positions after plugged into the TOSA assembly 210a for improving assembly robustness.

Additionally, a silicon photonics (Sipho) cap 250 is added to dispose over the silicon photonics chip 230 for at least protect wire bonds between the chip (particularly the wire bonds for power the laser diodes) and PCB. This Sipho cap 250 is also configured to include a fiber routing structure. As the Sipho cap 250 is placed on top of the silicon photonics chip 230, fibers coming out the TOSA lasers can be chosen to not directly couple with the silicon photonics chip 230 in a short distance as in previous embodiment of the optical transceiver 200 but to be routed around this fiber routing structure associated with the Sipho cap 250 in a longer circles before coupling with the silicon photonics chip 230. The fibers coming from the optical input ports 218 and 219 are also guided to the fiber routing structure before being coupled with the silicon photonics chip 230. This change from short direct coupling to long fiber routed coupling can reduce fiber stress tremendously and increase system reliability greatly.

Furthermore, some other noticeable modifications can be seen from the exploded view. A single PAM-ASIC chip 203 is used to replace two or more ASIC chips 201, 202. A modified return spring 290 is provided for the pull handle 130a for reducing electric-magnetic interference during plug-in or release operation of the compact optical transceiver. Several new thermal pads 270 are added for improving thermal flow aiming to enhance performance of the optical transceiver. A pair of Torx screws 280 is used to replace cross-head screws for improving assembly.

Figure 3:
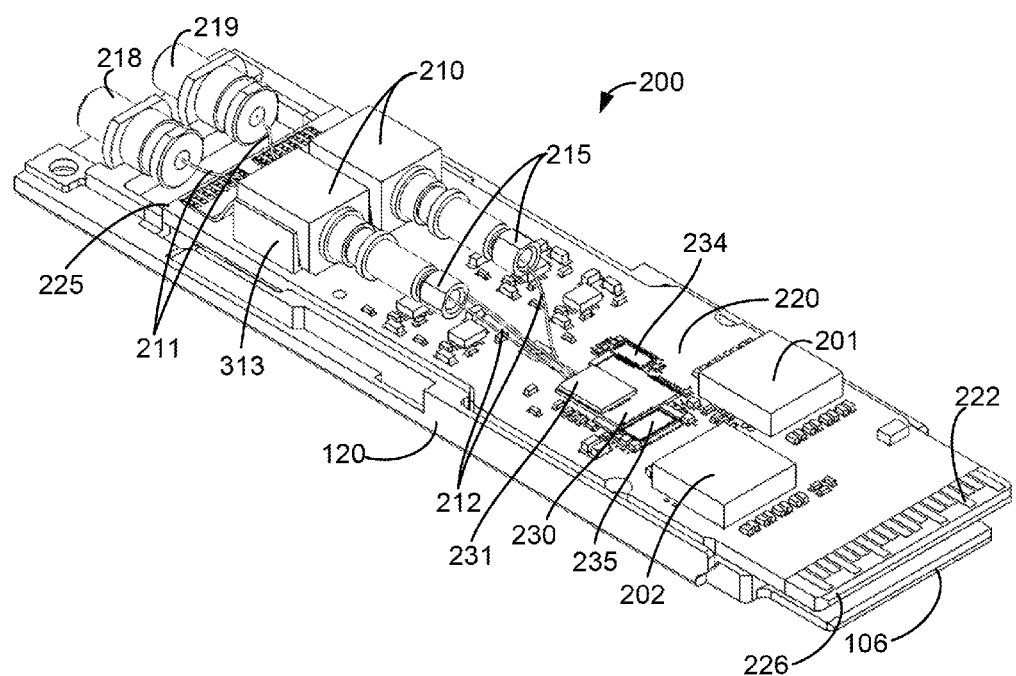
FIG. 3 is a perspective top view of a photonic transceiver on a circuit board according to an embodiment of the present invention.

FIG. 3 is a schematic top view of a photonic transceiver without the pull handle, lid member, and side members of the package structure according to the embodiment of the present invention. This diagram is merely an example, which should not unduly limit the scope of the claims. One of ordinary skill in the art would recognize many variations, alternatives, and modifications. As shown, the pull handle 130 and side members 140 are also removed from a base member 120 of the photonic transceiver package. PCB 220 and a pair of optical input and output ports 218, 219 for the photonic transceiver 200 are disposed on the base member 120.

In an embodiment, the photonic transceiver 200 includes one or more transmitting devices 210 installed on the PCB 220 near the front edge 225. In a specific embodiment, each of the transmitting devices 210 is a TEC-TOSA (thermo-electric cooled transmit optical sub-assembly) laser device. Each TEC-TOSA laser device 210 is configured (via a transmitting module inside) to produce one laser light at a specific wavelength outputted through a laser output port 215 with a single-mode fiber 212 and is coupled into a fiber-to-silicon photonics attachment module 231 pre-fabricated on the silicon photonics chip 230 which is mounted on the middle region of PCB 220. The fiber-to-silicon photonics attachment module 231 includes multiple V-grooves for coupling the optical fibers with silicon waveguides (not visible in FIG. 3) through which the light received externally can be directly guided to a March-Zehnder (MZ) modulator per channel (not visible in FIG. 3) capable of operating under PAM4 and NRZ protocol. In other words, this silicon photonics chip 230 is, contrary to some conventional photonics chips with internal laser diodes (LD), configured to receive light signal from external optical sources which are just the two TEC-TOSA laser devices 210 in the implementation of the present invention as shown in FIG. 3. This chip and package design make the manufacture of the silicon photonics chip 230 independent from any tuning process of the laser devices, thereby enhancing the robustness and reliability of the whole QSFP transceiver package.

In a specific embodiment, there can be at least two TEC-TOSA laser devices 210 in each QSFP package 100, which needs two MZ modulators correspondingly for the two channels of wavelengths of laser light. As mentioned in FIG. 2B, the silicon photonics chip 230 is coupled to the modulation driver module 234 by wire bonding. The driver module 234 is a two-channel silicon-germanium modulator driver for driving each of the two MZ modulators to modulate corresponding channels of laser light with different wavelengths into a desired optical signal. In a specific embodiment, after modulation, multiple lights with different wavelengths from the two or more TEC-TOSA laser devices 210 are multiplexed and outputted via the fiber-to-silicon attachment module 231 again to a single optical fiber 211 connected to optical output port 219 (with a LC or MPO connector) of the photonic transceiver 200.

On the other hand, the photonic transceiver device 200 is configured to receive optical signal via optical input port 218 which is passed through a single fiber 211 to the silicon photonics chip 230 first via the fiber-to-silicon attachment module 231. Then a demultiplexer (not visible in FIG. 3 but built in the silicon photonics chip 230) transforms it into different channels of light with different wavelengths being detected by one or more photodiodes (PDs) (not visible in FIG. 3) therein. Each light signal associated with a specific wavelength is converted into an electrical signal and further processed to a digital signal at least by the TIA module 235. Also mounted on the PCB 220 near the back edge 226 includes two port interface ASIC chips 201, 202 based on CMOS technology. One ASIC chip 201 is configured for electrical Tx module with 4×10G (total of 40 Gbit/s) XLAUI (40 Gigabit Attachment Unit Interface) electrical interface for connecting to Ethernet and 4×25G (total of 100 Gbit/s) CAUI (100 Gigabit Attachment Unit Interface) electrical interface, through which electrical signal can be transmitted out to Ethernet network via multiple metallic pin stripes 222 disposed as a pluggable electrical connector at the back edge 226 of the PCB 220. Another one ASIC chip 202 is configured for electrical Rx module with similar interfaces for receiving electrical signals from Ethernet network.

In a specific embodiment, the silicon photonics chip 230 is coupled to a PAM4 driver module 234 for driving two MZ modulators (single stage or multi-stage) for providing optical signal modulation. The PAM4 driver module 234 includes a PAM encoder and a FEC encoder with CDR Rx I2C interface coupled to ASIC chip 201 for converting data to optical signal in 4×10G to 4×25G rate. The PAM4 driver module 234 is based on 28 nm CMOS technology. Additionally, the silicon photonics chip 230 is also coupled to a TIA module 235 for processing electrical signals and converting them to digital signals. The electrical signals are converted by one or more PDs from demultiplexed light signals out of an incoming optical signal received from the optical input port 218. The TIA module 235, also based on 28 nm CMOS technology, includes PAM ADC/DSP CDR and PAM decoder with CDR Tx interface coupled to ASIC chip 202 for converting optical signal to digital signal in 4×10G to 4×25G rate for converting optical signal to digital signal in 4×10G to 4×25G rate and provide electrical interface communication with Ethernet network via the pluggable multiple metallic pin stripes 222.

In a specific embodiment, the TEC-TOSA laser device 210 is laid in a reversed configuration with laser output port 215 pointing toward the back edge 226 of the PCB 220, just opposite to that of the conventional transceiver device whose laser output port is pointed to the optical fiber output port 219 (with a LC connector) near the front end 105 of the photonic transceiver package 100 (see FIG. 1B). Such reversed configuration allows the built-in fiber-to-silicon photonics attachment module 231 on the silicon photonics chip 230 to directly face the laser output port 215 for properly coupling each fiber 212 to the silicon photonics chip 230. The silicon photonics chip 230 itself can be disposed closer to the ASIC chips 201/202 near the back edge 226 of the PCB 220 for simplification of circuit board wire bonding.

In another specific embodiment, shown in FIG. 3, each TEC-TOSA laser device 210 is disposed in upside-down fashion compared to conventional package. In this upside-down package, the TEC-TOSA laser device 210 includes a cover member 313 disposed to the bottom side resting on the PCB and a thermoelectric cooler (TEC) base with a flat surface region facing upward in FIG. 3. The TEC base is used for directly mounting a TEC module for cooling corresponding laser chip inside the TEC-TOSA laser device 210. The flat surface region (as seen in FIG. 3) of the TEC base is then configured to be in thermal contact (possibly via a submount pad or other medium) with the lid member 110 when the transceiver QSFP package structure 100 is completely assembled. Usually, any external heat sink (not shown) is attached with the lid member 110. The thermal contact formed directly between the flat surface of the TEC base with the lid member in above package structure provides a direct pathway for efficient heat dissipation from the laser chip to an external heat sink for maintaining stable wavelength of the output laser light In yet another specific embodiment, the photonic transceiver 200 in this embodiment applies technology of wavelength-division multiplexing (WDM), two or more TEC-TOSA laser devices 210 to use a Distributed Feedback (DFB) or Fabry-Perot (FP) laser diode to generate laser light of different wavelengths at any channels of dense-wavelength-division-multiplexing spectrum band. Two channels can further be combined into one single-mode optical fiber via wavelength-division multiplexer for middle distance and long distance transmission. Next, the received optical signal is performed a light-split process by the demultiplexer and the split optical signals are introduced to different channels. In this embodiment, except WDM technology, the photonic transceiver package 100 also can be applied to related optical communication technologies, such as binary phase shift keying modulation (BPSK), quadrature phase shift keying modulation (QPSK), conventional/coarse wavelength division multiplexing (CWDM), dense wavelength division multiplexing (DWDM), and optical add/drop multiplexer (OADM), reconfigurable optical add/drop multiplexer (ROADM).

Figure 3A:
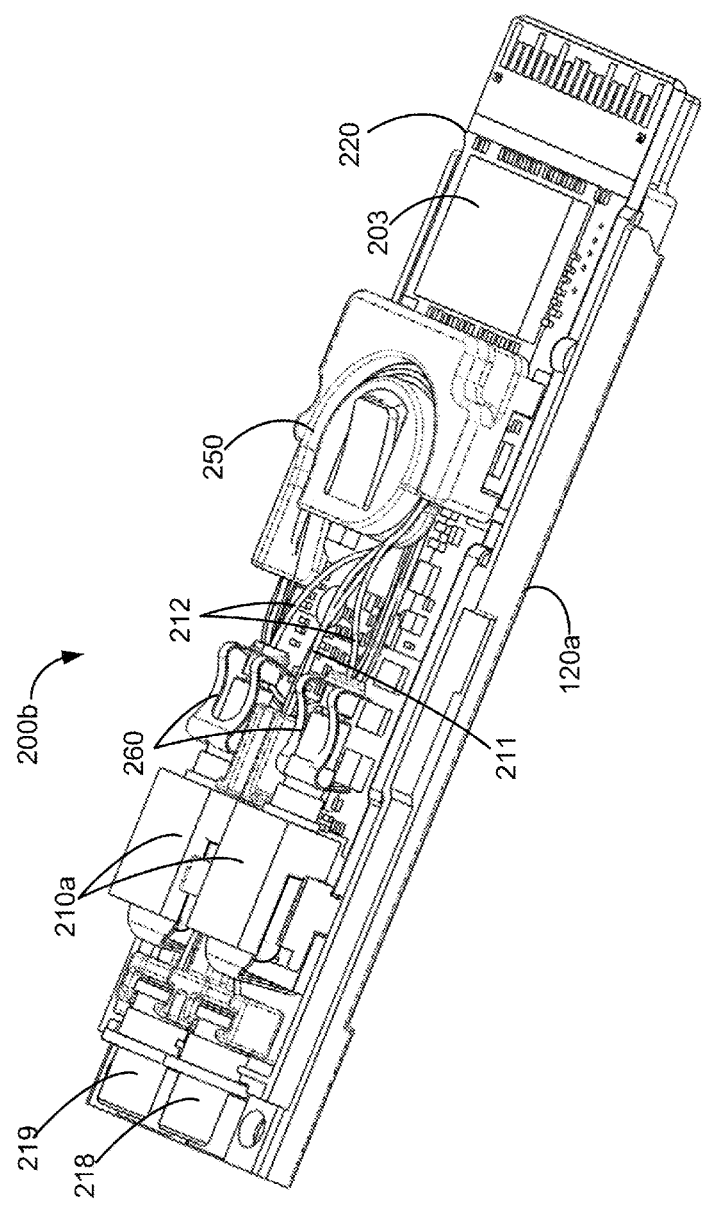
FIG. 3A is a perspective top view of a photonic transceiver on a circuit board according to another embodiment of the present invention.

FIG. 3A is a perspective top view of a photonic transceiver on a circuit board according to another embodiment of the present invention. This diagram is merely an example, which should not unduly limit the scope of the claims. One of ordinary skill in the art would recognize many variations, alternatives, and modifications. As shown, the photonic transceiver 200b including modified TOSA laser assembly 210a and newly added fiber routing structure associated with a Sipho cap 250 is disposed on the PCB 220 with a pair of optical input and output ports 218, 219 on the base member 120a. The fiber routing structure allows the fibers 212 that come out of the TOSA lasers and fibers 211 from the optical input/output ports 218/219 to be routed in a longer route before coupling with the silicon photonics chip (under the Sipho cap 250). Thus, large fiber coupling stress due to direct coupling of the short fiber to the silicon photonics chip is relaxed, enhancing system reliability.

Additionally, FIG. 3A shows that two clips 260 are in position to respectively firmly hold two LC Ferrules 215 plugged into the output ports of TOSA assembly. The LC Ferrule 215 is tailed with optical fiber for transmitting laser light from TOSA laser to silicon photonics chip 230. A single PAM-ASIC chip 203 is also used to replace multiple ASIC chips in previous embodiment of the optical transceiver 200 shown in FIG. 3.

Figure 4:
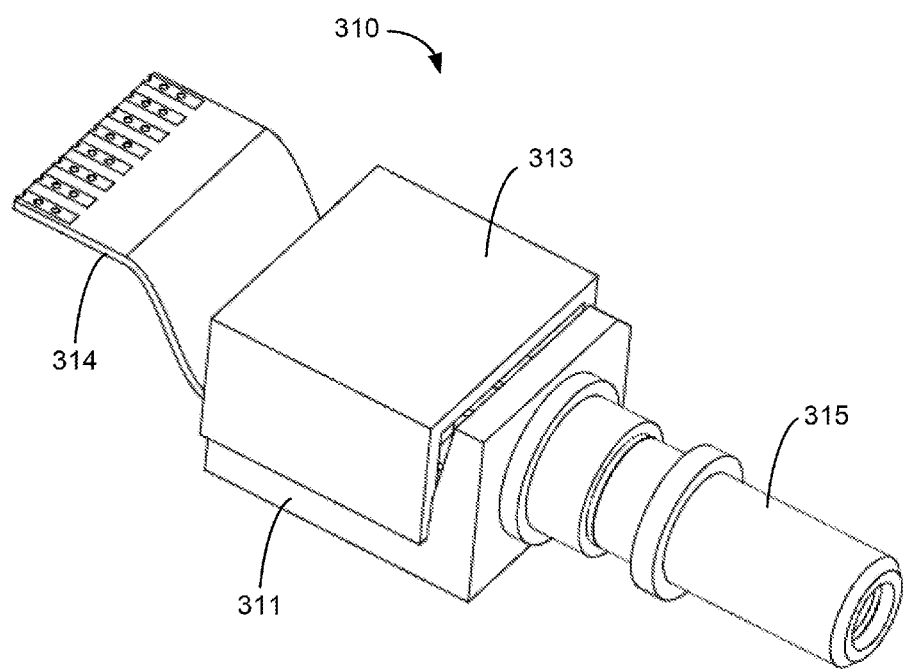
FIG. 4 is a perspective bottom view of a TEC-TOSA laser device for the photonic transceiver according to an embodiment of the present invention.

FIG. 4 is a perspective bottom view of a TEC-TOSA laser device for the photonic transceiver according to the embodiment of the present invention. This diagram is merely an example, which should not unduly limit the scope of the claims. One of ordinary skill in the art would recognize many variations, alternatives, and modifications. As shown, TEC-TOSA laser device 310 includes a TEC base 311 for supporting a TEC module and a transmitting module (both are not directly visible in FIG. 4), a cover 313 covering above the transmitting module, a curved circuit board 314 disposed at one side of the TEC base 311, and a cylindrical element 315 mounted at another side of the TEC base 311. The TEC module is designed for keeping the wavelength of laser light generated by the FP laser diode stabilized during any environmental temperature changes. The TEC base 311 is made of metal material and can assist the transmitting module to dissipate heat.

Figure 4A:
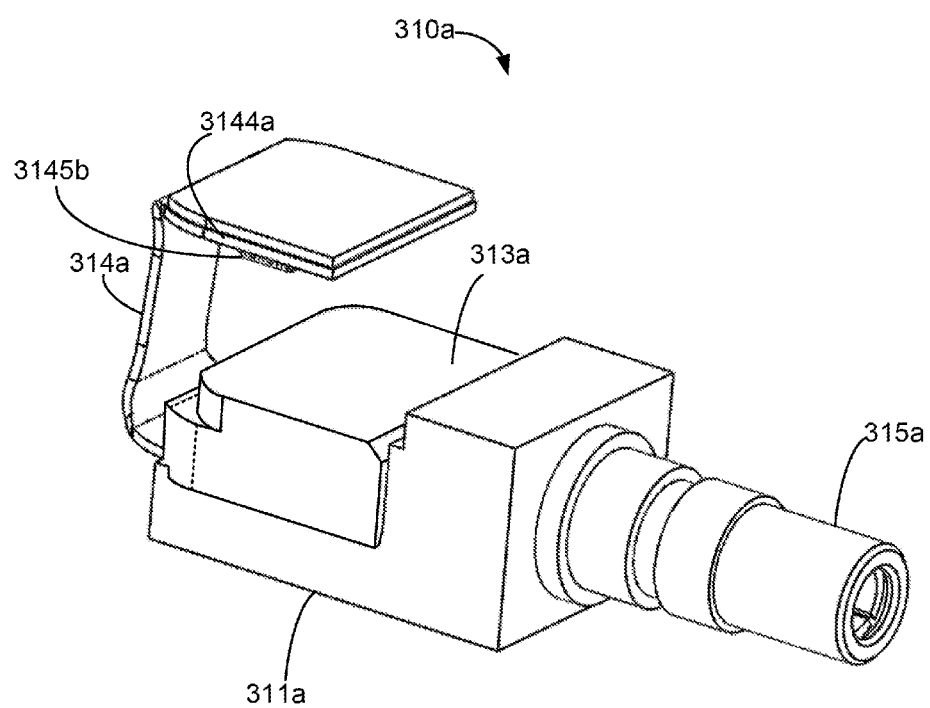
FIG. 4A is a perspective bottom view of a TEC-TOSA laser device for the photonic transceiver according to another embodiment of the present invention.

FIG. 4A is a perspective bottom view of a TEC-TOSA laser device for the photonic transceiver according to another embodiment of the present invention. This diagram is merely an example, which should not unduly limit the scope of the claims. One of ordinary skill in the art would recognize many variations, alternatives, and modifications. As shown, the modified TEC-TOSA laser device 310a is assembled by similar members as one shown in FIG. 4, including a TEC base 311a, a cover member 313a, a flex circuit board 314a, and a cylindrical element 315a. The TEC base 311a is designed for supporting a TEC module and a transmitting module (both are not directly visible due to the cover member 313a). The flex circuit board 314a, as shown, is bended in a configuration with a first flat region (not visible due to the cover member 313a) being disposed on an inner surface of a plane part of the TEC base 311 and a second flat region 3144a, separated from the first flat region by a middle region, being bended inward at a distance apart from and in parallel to the first flat region. The second flat region 3144a is coupled to an electrical connector 3145b configured to be mounted with the PCB. Unlike the outward bending configuration of the previous flex circuit board 314 (see FIG. 4) with electrical pins being mounted on top surface of the PCB, the inward-bending configuration of the second flat region allows the electrical connector 3145b being disposed over an edge of the PCB to mount on the bottom surface of the PCB. This embodiment allows utilization of both surfaces of the PCB and release some extra PCB area on the top surface for improving the TOSA-based transceiver package. Further shown in FIG. 4A and similar to previous embodiment in FIG. 4, the cylindrical element 315a is mounted at an outer side of vertical assembling part of the TEC base 311a.

Figure 5:
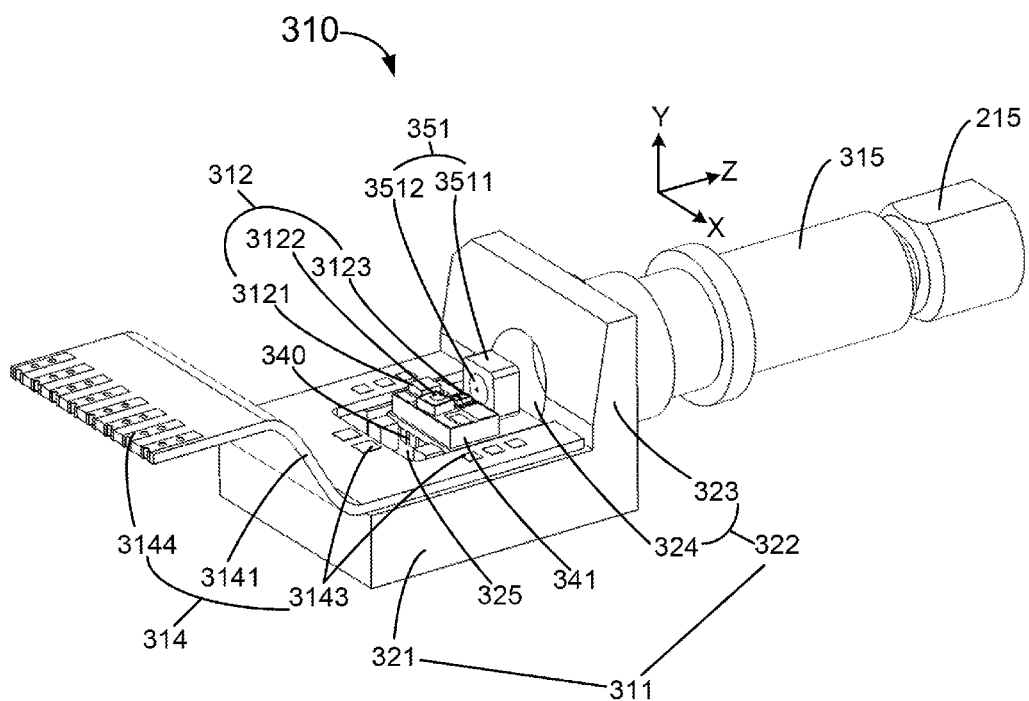
FIG. 5 is a perspective view of a TEC-TOSA laser device for the photonic transceiver without cover according to an embodiment of the present invention.

FIG. 5 is a perspective view of the TEC-TOSA laser device for the photonic transceiver without cover according to the embodiment of the present invention. This diagram is merely an example, which should not unduly limit the scope of the claims. One of ordinary skill in the art would recognize many variations, alternatives, and modifications. As shown, with the cover 313 being removed, the TEC base 311 is substantially visible with a plane part 321, and an assembling part 322 disposed on one end the plane part 321. The plane part 321 includes a hollow region 325 for holding a TEC module 340 on which a submount 341 is placed. One end of the flex circuit board 314 is integrated with the TEC base 311 and bended in the middle region to have other end to be leveled at a different height for mounting with connection spots on the PCB 220 (as the laser device 310 is mounted in upside-down configuration on the PCB 220).

Referring to FIG. 5, further, the transmitting module 312 comprises a thermistor 3121, a monitor photo diode (MPD) chip 3122, a DFB or FP laser diode (LD) chip 3123 disposed on the submount 341. The assembling part 322 comprises a vertical portion 323 disposed at the end of the plane part 321. An annular hole 324 is disposed inside the vertical portion 323 and corresponds to the transmitting module 312. The annular hole 324 is disposed correspondingly to allow the coupling lens assembly 351 aligned the LD chip 3123 of the transmitting module 312 for coupling laser light along a central line into the cylindrical element 315. The coupling lens assembly 351 comprises a square metal outer part 3511 fixed on a flat surface of the TEC module 340 in front of the annular hole 324, holding a lens body 3512. The lens body 3512 comprises an aspherical lens with curved surfaces on both sides having radius of curvature changes according to distance from the optical axis for achieving improved laser light coupling efficiency. During manufacturing process, filler material is sealed into a space over the transmitting module 312 between the cover 313 (see FIG. 4 and it is removed in FIG. 5 with upside-down view) and the plane part 321 of the TEC base 311 by infusion or welding, in order to achieve the objective of sealing the transmitting module 312. The structure of the cylindrical element 315 will be described in detail in following content.

Referring to FIG. 5 again, the flex circuit board 314 comprises a board body 3141 bended in the middle region with a U-shaped end formed with multiple electrical connection spots 3143 and a flat end, opposite to the U-shaped end, formed with electrical connection stripes 3144. The U-shaped end is fixed on the plane part 321 of the TEC base 311 by epoxy gluing. The transmitting module 312 and TEC module 340 are connected electrically to the electrical connection spots 3143 of the flex circuit board 314 by wire bonding, spot welding or conductive epoxy. The flat end with electrical connection stripes 3144 is used for mounting on to the printing circuits in the PCB 220 near the front edge 225 by electrical welding, spot welding or slot connection, so as to transmit the excitation signal from the signal process module on the PCB 220 to the transmitting module 312.

The cylindrical element 315 of the laser device 310 is mounted on the assembling part 322 correspondingly connecting to the laser output port 215 (with the optical fiber 212 as shown in FIG. 3 but the fiber is not visible in FIG. 5). In this embodiment, the coupling lens assembly 351 is disposed at one end of the cylindrical element 315 and the cylindrical element 315 is configured to adjust its parts in both X-Y plane and Z-space so as to properly couple the laser light emitted from the transmitting module 312 through the cylindrical element 315 and to output from laser output port 215 to the optical fiber 212.

Figure 5A:
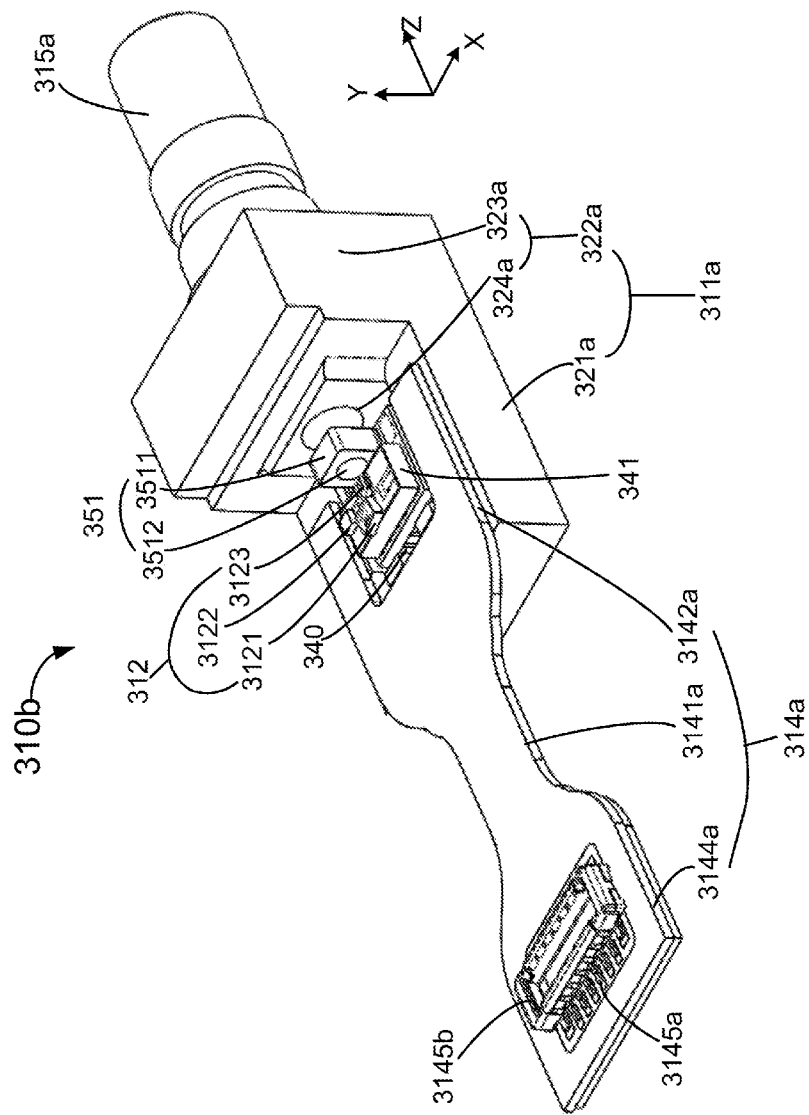
FIG. 5A is a perspective view of a TEC-TOSA laser device for the photonic transceiver without cover according to another embodiment of the present invention.

FIG. 5A is a perspective view of a TEC-TOSA laser device for the photonic transceiver without cover according to another embodiment of the present invention. This diagram is merely an example, which should not unduly limit the scope of the claims. One of ordinary skill in the art would recognize many variations, alternatives, and modifications. As shown, several modified features of TEC-TOSA laser device 310b are revealed after the cover member 313a is removed to reveal the flex circuit board 314a that is in a fully flat configuration (before bended to the designated shape shown in FIG. 4A) including a first flat region 3142a connected to a second flat region 3144a by a middle region 3141a having a reduced width. In this embodiment, the second flat region 3144a of the flex circuit board 314a includes some pre-fabricated conducting pins 3145a configured to couple with a PCB connector 3145b. Additionally, the TEC base 311a has a planar region 321a having a recessed portion for installing the TEC module 340 which further supports the submount 341. The planar region 321a is also used to couple with the first flat region 3142a of the flex circuit board 314a, substantially the same way as previous one 321 shown in FIG. 5. The TEC module 340 and submount 341 also can be the same as those shown in FIG. 5 without substantially structure modification. Similarly, a transmitting module 312 including a thermistor 3121, a monitor photo diode (MPD) chip 3122, and a DFB or FP laser diode (LD) chip 3123 is disposed on the submount 341.

In front of the LD chip 3123 a coupling lens assembly 351 is disposed with alignment to allow laser beam being substantially coupled through the center portion of an aspherical lens body 3152 held by a square shaped frame 3151. The coupling lens assembly 351 is also disposed on top of the TEC module 340 (following the light path) behind the LD chip 3123 while in front of an annular hole 324a formed from an inner side of the vertical assembling part 323a. The annular hole 324a is to allow the coupling lens assembly 351 aligned of the transmitting module 312 to couple emitted laser light from the LD chip 3123 and pass through into the cylindrical element 315a which is mounted from outer side of the vertical assembling part 323a.

One noticeable difference of this embodiment versus previous one is that the assembling part 323a of the TEC base 311a is made to be thicker than the counterpart 323 of the previous embodiment so that the mounting structure of the cylindrical element 315a and associated isolator assembly are modified. More details of the cylindrical element 315a are given below.

Figure 6:
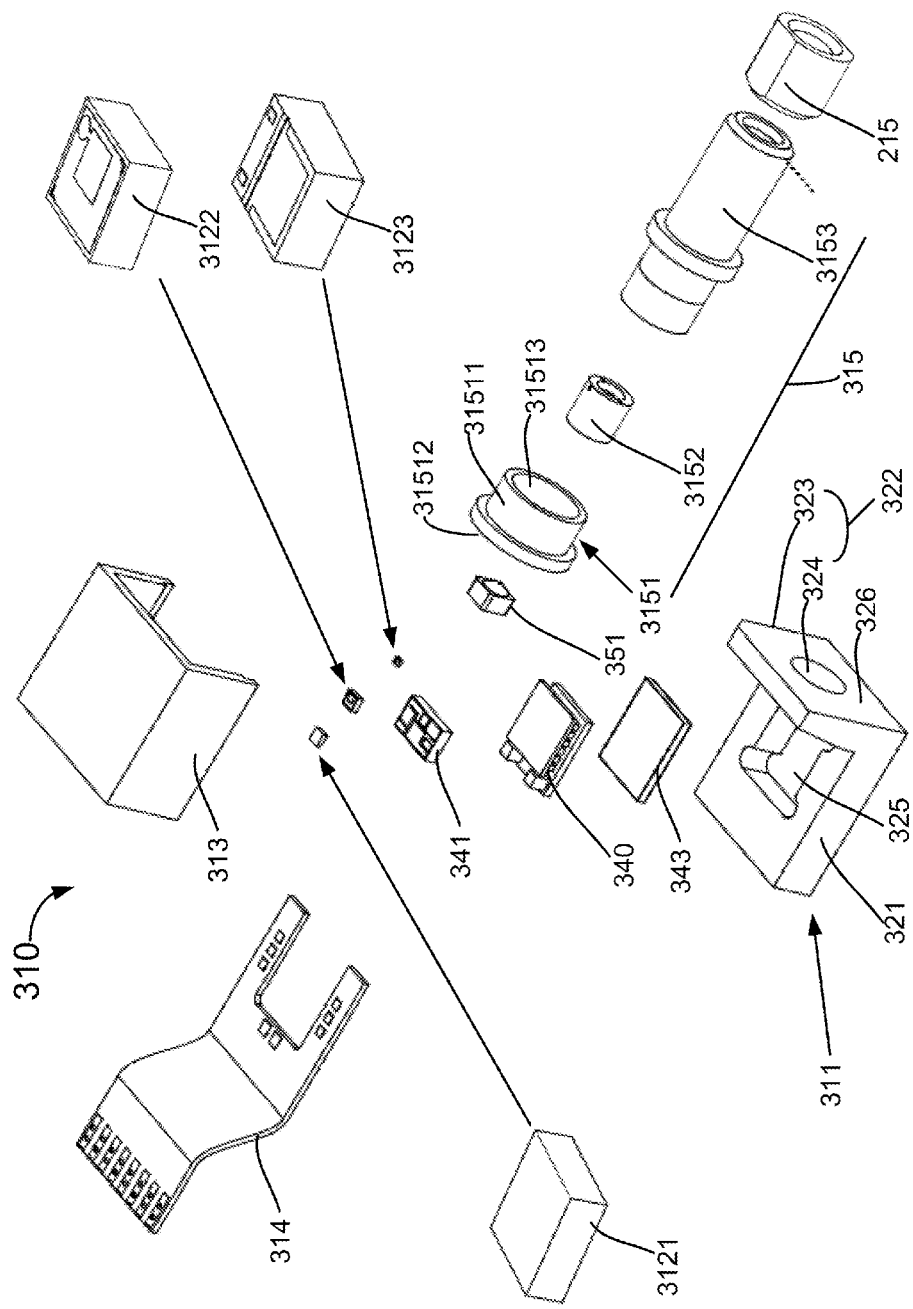
FIG. 6 is an exploded view of the TEC-TOSA laser device according to an embodiment of the present invention.

FIG. 6 is an exploded view of the TEC-TOSA laser device according to an embodiment of the present invention. This diagram is merely an example, which should not unduly limit the scope of the claims. One of ordinary skill in the art would recognize many variations, alternatives, and modifications. As shown, the cylindrical element 315 of the laser device 310 can be disassembled into a Z-space member 3151 with plane adjusting mechanism, an isolator 3152, a cylindrical receptacle member 3153 with light distance adjusting mechanism together with optical fiber connection mechanism, arranged in order from left to right. The isolator 3152, when being assembled, shall be in an axial location surrounded mainly by the Z-space member 3151 and at least partially by the cylindrical receptacle member 3153. The optical fiber connection mechanism is configured to include a fiber ferrule ring 215 for holding the single mode fiber 212 as seen in FIG. 3. The components of the transmitting module 312 including the thermistor 3121, the MPD (monitor photodiode) chip 3122, and the LD chip 3123 are respectively shown with enlarged view and are all mounted on the submount 341. The TEC module 340 actually is sandwiched by the submount 341 on top and another submount 342 at bottom to provide heat dissipation for the transmitting module 312. The submount 342 is leveled with an outer surface of the plane part 321 of TEC base 311 for proper contacting with the lid member 110. All the parts of the TEC module plus two submounts and the transmitting module will be disposed in the hollow region 325 of the planar part 321 of the TEC base 311.

Figure 6A:
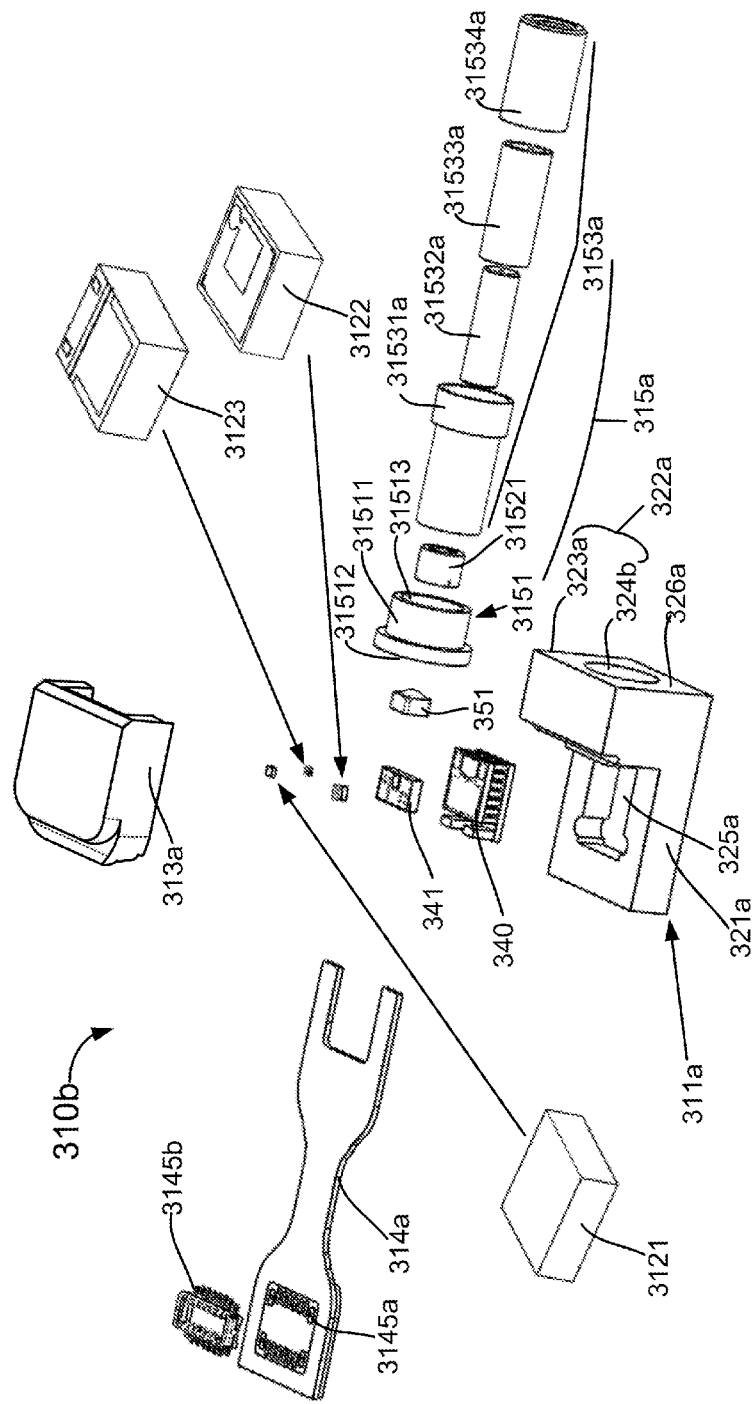
FIG. 6A is an exploded view of the TEC-TOSA laser device according to another embodiment of the present invention.

FIG. 6A is an exploded view of the TEC-TOSA laser device according to another embodiment of the present invention. This diagram is merely an example, which should not unduly limit the scope of the claims. One of ordinary skill in the art would recognize many variations, alternatives, and modifications. As shown, the cylindrical element 315a of the laser device 310b can be disassembled into a Z-space member 3151 with plane adjusting mechanism, an isolator assembly 31521, a cylindrical receptacle assembly 3153a with light distance adjusting mechanism together with optical fiber connection mechanism, arranged in order from left to right. The cylindrical receptacle assembly 3153a includes a lead cylindrical member 31531a coupled sequentially with overlaps by three cylindrical tubes (31532a-31534a) with increasing diameters. The lead cylindrical member 31531a is inserted into the Z-space member 3151 for applying its light distance adjusting mechanism. The isolator assembly 31521 is attached to an inner end of this lead cylindrical member 31531a and shall be in an axial location in a cylindrical housing 324b within the assembling part 322a (to be seen in a cross-section view in FIG. 9A below). The cylindrical shaped housing 324b is located behind the annular hole 324a.

The three cylindrical tubes are respectively slid in the lead cylindrical member 31531a one after another, through which the optical fiber connection mechanism of the cylindrical receptacle assembly 3153a is configured to be ferrule receptacle allowing a fiber ferrule tailed with an optical fiber to be plugged in from the outer end of these cylindrical tubes. In a specific embodiment, the cylindrical receptacle assembly 3153a support LC receptacle for plugging a LC ferrule holding the single mode fiber (212 as seen in FIG. 3). The components of the transmitting module 312 including the thermistor 3121, the MPD (monitor photodiode) chip 3122, and the LD chip 3123 are respectively shown with enlarged view and are all mounted on the submount 341, substantially no change from previous embodiment (FIG. 6). A modified flex circuit board 314a is shown in flat configuration including a middle region with reduced width, a first flat region having a "U" shaped structure for mounting on the planar region 321a of the TEC base 311a, and a second flat region 3144a with prefabricated electrical conduction pins 3145a. An separate connection device 3145b is shown to be compatible with the electrical conduction pins 3145a and is used for making connection between the flex circuit board 314a of the TOSA assembly 310b and the bottom surface of the PCB (220).

Figure 7:
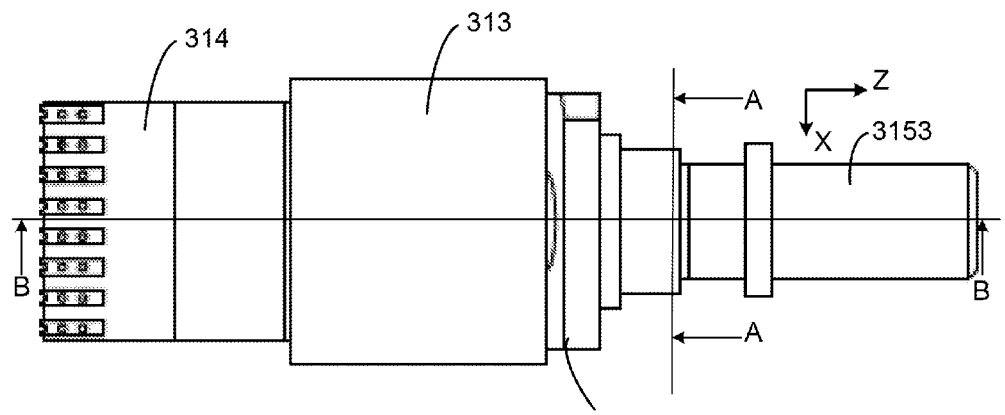
FIG. 7 is a top view of a TEC-TOSA laser device according to an embodiment of the present invention.
Figure 8:
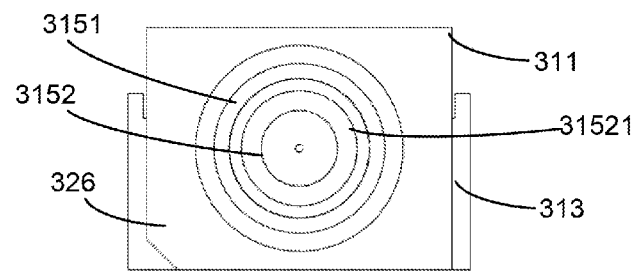
FIG. 8 is a side view of the TEC-TOSA laser device of FIG. 7 according to the embodiment of the present invention.

FIG. 7 is a top view of the TEC-TOSA laser device according to an embodiment of the present invention. FIG. 8 is a cross-section view of the TEC-TOSA laser device of FIG. 7 along line A-A according to the embodiment of the present invention. Please refer to FIG. 4 through FIG. 8 for detail structure of the TEC-TOSA laser device 310. As shown in FIG. 6 and FIG. 7, the Z-space member 3151 is integrated on the assembling part 322 by welding after coupling calibration is completed, and space between the Z-space member 3151 and the assembling part 322 is sealed by infusing filler. For X-Y plane calibration, the assembling part 322 of the TEC base 311 comprises a first connection plane 326 disposed at one side of the vertical portion 323. The Z-space member 3151 comprises a tubular body 31511 and second connection plane 31512 disposed at one side of the tubular body 31511. The second connection plane 31512 corresponds to the first connection plane 326. During calibration, a calibration device is used to adjust the relative position between the Z-space member 3151 and the assembling part 322 to align the tubular body 31511 with the annular hole 324 of the assembly part 322. After the calibration is done, the first connection plane 326 is fixed on the second connection plane 31512 by laser spot welding, and then X-Y plane calibration is completed.

Further shown in FIG. 6, the cylindrical receptacle member 3153 with the light distance adjusting mechanism is integrated onto the Z-space member 3151 by welding after the coupling calibration is completed, and the space between them is sealed by infusing filler. For Z-axis calibration, in the Z-space member 3151 includes a groove track (not shown) disposed at the disposal slot 31513 at one side of the body 31511 opposite to the second connection plane 31512. The disposal slot 31513 is for inserting a coupling portion 31531 of the cylindrical receptacle member 3153. The coupling portion 31531 is movable along the groove track. The coupling portion 31531 further includes an inner disposal slot 31533 for holding the isolator 3152 and a recessed outer disposal ring 31532 for engaging with the cylindrical receptacle member 3153. After the isolator 3152 is installed and Z-axis calibration is completed, the coupling portion 31531 is fixed to the Z-space member 3151 by laser welding or other welding methods. The cylindrical receptacle member 3153 further includes a sleeve body 31534 for being engaged with the recessed outer disposal ring 31532 of the coupling portion 31531 and an optical fiber coupling channel 31535 inserted in the axial position.

Figure 9:
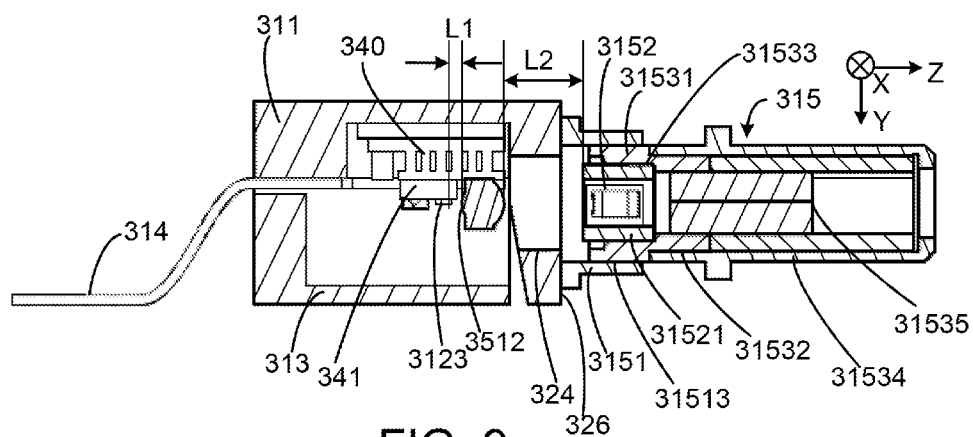
FIG. 9 is a cross-section view of the TEC-TOSA laser device of FIG. 7 along line B-B according to the embodiment of the present invention.

FIG. 9 is a cross-section view of the TEC-TOSA laser device of FIG. 7 along line B-B according to a specific embodiment of the present invention. Referring FIG. 9 and FIG. 6, the Z-axis calibration is easily illustrated. As shown, a distance from the LD chip 3123 of the transmitting module 312 to the lens body 3512 is defined as L1, and a distance from the lens body 3512 to the isolator 3152 is defined as L2. In this embodiment, the lens body 3512 (wrapped by the outer part 3511) is disposed directly on a flat (cold side) surface of the TEC module 340 in front of the annular hole 324. The distance L1 from the LD chip 3123 to the lens body 3512 is a fixed value adapted to the curvature of the aspherical lens for achieving optimal optical coupling of the emitted laser light from LD chip 3123 before curing the epoxy for bonding the outer part 3511 on the flat surface of the TEC module 340. But the distance L2 from the lens body 3512 to the isolator 3152 is adjusted according to the cylindrical receptacle member 3153 and the isolator 3152 moving along the groove track of the Z-space member 3151. As L1 is fixed, for better coupling efficiency, length of L2 tends towards a fixed value due to convergence characteristic of the lens body 3512. Therefore, the length of L2 depends on the length of L1. For biconvex lens, such configuration may increase the tolerance between the cylindrical receptacle member 3153 and the Z-space member 3151 since L2>L1, so that difficulty in process can be reduced.

Further in a specific embodiment, the isolator 3152 is disposed in a mechanical frame 31521 (FIG. 8 and FIG. 9).

The isolator frame 31521 is inserted into the inner disposal slot 31533 of the coupling portion 31531 which is inserted into the disposal slot 31513 of the Z-space member 3151 (see FIG. 9). The isolator 3152 can be also disposed to connect one side of the external optical fiber, but it is not limited thereto. The optical fiber connection mechanism associated with the cylindrical receptor member 3153 is formed with the light coupling channel 31535 disposed along axial direction. One end of the light coupling channel 31542 is configured to couple with a fiber ferrule (215) for connecting an external optical fiber 212 correspondingly.

Figure 10:
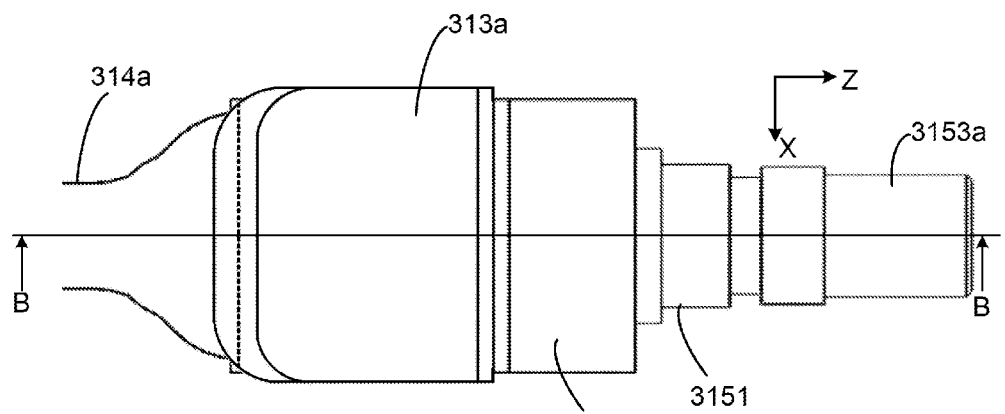
FIG. 10 is a top view of a TEC-TOSA laser device according to another embodiment of the present invention.
Figure 11:
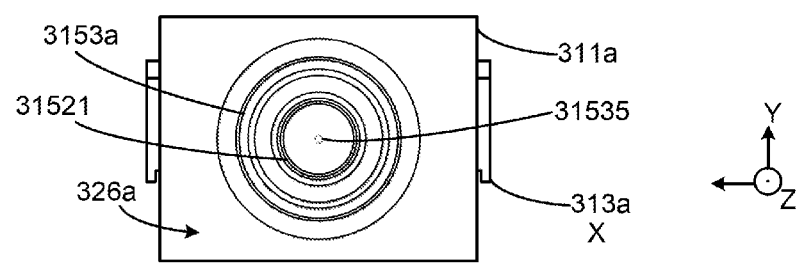
FIG. 11 is a side view of the TEC-TOSA laser device of FIG. 10 according to the embodiment of the present invention.

FIG. 10 is a top view of a TEC-TOSA laser device according to another embodiment of the present invention. FIG. 11 is a side view of the TEC-TOSA laser device of FIG. 10 according to the embodiment of the present invention. Please link the following descriptions of the TEC-TOSA laser device 310b through FIGS. 10-12 to FIG. 4A, FIG. 5A, and FIG. 6A for understand the detail structures of the modified TEC-TOSA assembly. As shown in FIG. 10, the cylindrical receptacle assembly 3153a is in assembled position coupled to the Z-space member 3151. The TEC base member 311a, now is viewed from top, has a thicker assembling part comparing to previous embodiment (FIG. 7). FIG. 8A shows a view from Z-axis with the outer side 326a of the vertical assembling part 323a (see FIG. 5A and FIG. 6A) being fully exposed. Other axial-aligned components include the receptacle assembly 3153a and optical fiber coupling channel 31535.

Figure 12:
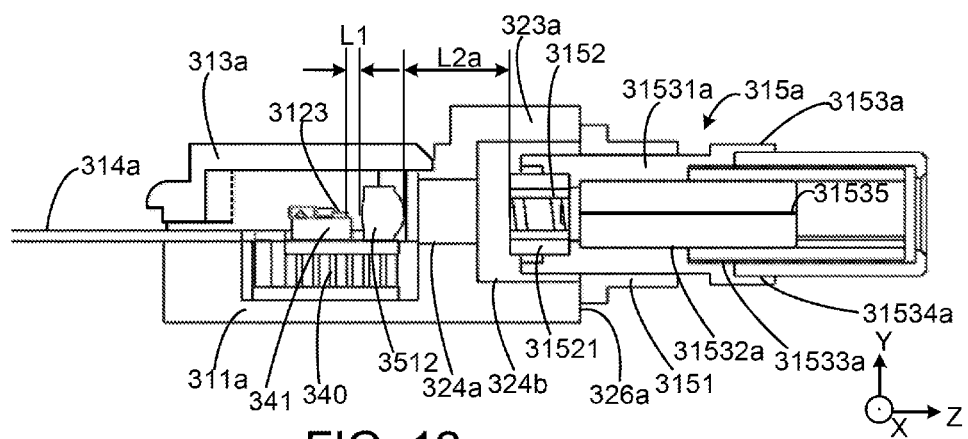
FIG. 12 is a cross-section view of the TEC-TOSA laser device of FIG. 10 along line B-B according to the embodiment of the present invention.

FIG. 12 is a cross-section view of the TEC-TOSA laser device of FIG. 10 along line B-B according to the embodiment of the present invention. As shown, one of main modification is the increase of thickness of the vertical assembling part 323a to allow an empty housing 324b formed internally next to the annular hole 324a aligned in Z-axis. The annular hole 324a is near the lens body 3512 and the housing 324b is at least large enough to enclose an isolator 3152 held by a round-shaped mechanical frame 31521. The isolator in the frame 31521 is actually attached to an inner end of the lead cylindrical member 31531 of the cylindrical receptacle assembly 3153a and is just disposed in the middle of the housing 324b within the vertical assembling part 323a when the cylindrical receptacle assembly 3153a is inserted through the Z-space member 3151. Similar to the previous embodiment of TOSA assembly 310 (FIG. 9), the distance from the LD chip 3123 to a first spherical surface of the lens body 3512 is defined as L1 without change. But the distance L2a from a second spherical surface of the lens body 3512 to the isolator 3152 is enlarged comparing to the counterpart L2 of previous embodiment 310. Since the isolator 3152 is actually mounted at inner end of the cylindrical receptacle assembly 3153a, real distance L2a can be adjustable by tuning Z-position of the cylindrical receptacle assembly 3153a inside the Z-space 3151. As L1 is fixed, the larger distance of L2a (than L2) provides better coupling efficiency of the laser light emitted from the LD chip 3123 due to convergence characteristic of the aspherical lens body 3512.

In the embodiment of the modified TOSA assembly, another main change is the reconfiguration of the cylindrical element 315a. In particular, since the isolator 3152 assembled in its frame 31521 now is positioned inside the housing 324b within the vertical assembling part 323a which is beyond the range of just Z-space member 3151, the cylindrical receptacle assembly 3153a in this embodiment actually has an extended length for applying its light distance adjusting mechanism pass, allowing larger adjustment room on the distance L2a with enhanced operation robustness. The optical fiber connection mechanism associated with the cylindrical receptacle assembly 3153a is formed by three cylindrical tubes 31532a, 31533a, and 31534a one hooked to another with increasing diameters. The three cylindrical tubes are inserted and sequentially fitted respectively with three disposal slots with increasing matching inner diameters. The diameters and lengths of the three cylindrical tubes are configured to form a LC receptacle that allows a LC fiber ferrule 215 (not shown here) to be plugged in. A light coupling channel 31535 of the inner cylindrical tube is aligned to the Z-axis direction and supposed to couple with fiber core inside the fiber ferrule 215 tailed with an optical fiber to allow laser light to pass through with low loss.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A package structure for a photonic transceiver comprising:
   a case, comprising a top shell member, a bottom shell member, and a pull handle attached with two partial side members being connected to the top shell member and bottom shell member, providing a spatial volume with a first open end and a second open end;
   a PCB installed inside the spatial volume on the bottom shell member for mounting the photonic transceiver, the PCB including a pluggable electrical interface connector near the second open end, the photonics transceiver comprising a silicon photonics chip, a PAM-ASIC chip, and two TOSA laser assemblies, each TOSA laser assembly being disposed in an upside-down configuration with a TEC module being in thermal contact with the top shell member and having a laser output port aiming toward the second open end;
   a cap structure disposed over the silicon photonics chip, the cap structure comprising fiber routing mechanism for routing a first optical fiber coming out of each laser output port of the two TOSA laser assemblies before the first optical fiber being guided to couple with the silicon photonics chip;
   an optical input port and an optical output port disposed on the bottom shell member near the first open end and respectively tailed with a pair of second optical fibers, each second optical fiber being routed by the cap structure before being guided to couple with the silicon photonics chip.

2. The package structure of claim 1 further comprising a dust cap configured to plug into the first open end.

3. The package structure of claim 1 wherein each TOSA laser assembly comprises a flex circuit board having a flat end region coupled with a prefabricated electrical connector configured to be mounted on a back side of the PCB with the flex circuit board being bended inward in 180 degrees over an end edge of the PCB.

4. The package structure of claim 1 wherein each TOSA laser assembly comprises a TEC base member having a plane part naturally joined with a vertical assembling part, a transmitting module including at least a laser diode chip mounted on a submount attached to the TEC module disposed in a recessed region of the plane part, an framed lens mounted on the TEC module and aligned to the laser diode chip, a circuit board being bended in middle region so that a first end is attached to the plane part and a second end is headed back at a second level in parallel to the plane part, a cylindrical Z-space member attached to the vertical assembling part, a cylindrical receptacle assembly including a lead cylindrical member coupled co-axially with multiple cylindrical tubes with increasing diameters, and an isolator assembly attached at an inner end of the lead cylindrical member passing through the cylindrical Z-space member.

5. The package structure of claim 4 wherein the isolator assembly includes an isolator held by a cylindrical shaped frame configured to be disposed inside an empty housing within the vertical assembling part.

6. The package structure of claim 5 wherein the isolator is configured to be aligned to the framed lens in an optical path through an annular hole, the framed lens comprising an aspherical lens body having a first spherical surface separated by a first distance from the laser diode chip and a second spherical surface separated by a second distance from the isolator.

7. The package structure of claim 6 wherein the second distance is adjustable to be several folds larger than the first distance by shifting the lead cylindrical member along axial direction.

8. The package structure of claim 4 wherein the second end of the circuit board comprises a plurality of electrical conducting pins configured to be plugged with an electrical connector for coupling with the PCB so that the TOSA laser assembly is disposed on the PCB in an upside-down configuration with a back surface of the plane part being in thermal contact with the top shell member.

9. The package structure of claim 4 wherein the TOSA laser assembly is mounted on the PCB via a TOSA holder configured to support the cylindrical receptacle assembly.

10. The package structure of claim 4 wherein the multiple cylindrical tubes with increasing diameters are configured to be a LC receptacle allowing a LC fiber ferrule to be plugged in, the LC fiber ferrule being maintained to its position by a clip.

11. The package structure of claim 10 wherein the cylindrical Z-space member is configured to adjust its X-Y position to allow an optimum alignment between a light coupling channel along axial direction of the LC receptacle and the isolator before fixedly attaching to the vertical assembling part.

12. The package structure of claim 1 wherein the top shell member and the bottom shell member are configured to have an overlapping seam mated edge structure with a wall at edges of top shell member being extended inside a wall of the bottom shell member for EMI compliance.

13. The package structure of claim 12 further comprising a form-in-place conductive gasket disposed at a lower step at inner side of the wall of the bottom shell member for contacting with the extended wall of the top shell member.

14. A method for packaging a compact photonics transceiver comprising:

providing a bottom shell member including a partial surrounding edge with a first overlapping seam structure;

mounting a PCB on the bottom shell member;

disposing a pair of TOSA laser assemblies on top of a holder on top side of the PCB, each TOSA laser assembly being positioned with its laser output port pointing towards a back end of the PCB and a TEC base facing upward;

disposing a pair of optical input/output ports in front of the PCB on part of surrounding edge with overlapping seam structure;

mounting a silicon photonics chip on the top side of the PCB behind a pair of laser output ports of the pair of TOSA laser assemblies;

disposing a cap structure over the silicon photonics chip, the cap structure being configured to be a fiber router for receiving optical fibers coming from both the pair of optical input/output ports and the pair of laser output ports before delivering these optical fibers to couple with the silicon photonics chip;

disposing a top shell member having partial surrounding side walls configured with a second overlapping seam structure matching with the first overlapping seam structure to engage with the bottom shell member;

installing a pull-release handle having two side members configured to couple with the side walls of the top shell member.

15. The method of claim 14 wherein the TOSA laser assembly comprises a LC receptacle at the laser output port supported by the holder and fixed by a clip structure.

16. The method of claim 14 wherein the first overlapping seam structure comprises a form-in-place feature disposed on the surrounding edge following its shape at inner side of a wall.

17. The method of claim 14 wherein the top shell member is fixed onto the bottom shell member at least by a pair of screws located near the optical input/output ports.

18. The method of claim 14 wherein installing a pull-release handle comprises using a return spring mechanism to couple with the side walls of the top shell member.

19. The method of claim 14 wherein disposing a top shell member comprises adding one or more thermal pads forming thermal contact between the TEC base of the TOSA laser assembly and inner surface of the top shell member.

20. The method of claim 14 wherein each TOSA laser assembly comprises a flex circuit board with a narrower middle part connected to a front part having an electrical connector mounted thereof, the flex circuit board being extended over an edge of the PCB and bended 180 degrees to allow the electrical connector on the front part to be mounted to a bottom side of the PCB as the TOSA laser assembly is disposed on the top side of the PCB.

* * * * *